United States Patent
Hidehiko et al.

(10) Patent No.: US 6,949,433 B1
(45) Date of Patent: Sep. 27, 2005

(54) METHOD OF FORMATION OF SEMICONDUCTOR RESISTANT TO HOT CARRIER INJECTION STRESS

(75) Inventors: Shiraiwa Hidehiko, San Jose, CA (US); Arvind Halliyal, Cupertino, CA (US); Jaeyong Park, Sunnyvale, CA (US)

(73) Assignee: FASL LLC, Sunnyvale, CA (US)

( * ) Notice: Subject to any disclaimer, the term of this patent is extended or adjusted under 35 U.S.C. 154(b) by 328 days.

(21) Appl. No.: 10/359,872

(22) Filed: Feb. 7, 2003

(51) Int. Cl.$^7$ ......................................... H01L 21/8247
(52) U.S. Cl. ..................................... 438/261; 438/954
(58) Field of Search .............................. 438/954, 776, 438/257–267, 761–763

(56) References Cited

U.S. PATENT DOCUMENTS

| | | | |
|---|---|---|---|
| 5,840,600 A | 11/1998 | Yamazaki et al. | 438/151 |
| 5,872,387 A | 2/1999 | Lyding et al. | 257/607 |
| 5,970,384 A * | 10/1999 | Yamazaki et al. | 438/795 |
| 6,306,777 B1 | 10/2001 | Ogle, Jr. et al. | 438/763 |
| 6,319,775 B1 | 11/2001 | Halliyal et al. | 438/261 |
| 6,319,809 B1 | 11/2001 | Chang et al. | 438/597 |
| 6,468,599 B1 | 10/2002 | Terada | 427/558 |

OTHER PUBLICATIONS

U.S. Appl. No. 10/429,447, filed May 5, 2003, entitled "Process for Reducing Hydrogen Contamination in Dielectric Materials in Memory Devices".

* cited by examiner

Primary Examiner—Richard A. Booth
(74) Attorney, Agent, or Firm—Renner, Otto, Boisselle & Sklar, LLP

(57) ABSTRACT

The present invention, in one embodiment, relates to a process for fabricating a semiconductor device that is resistant to hot carrier induced stress. The method includes the steps of forming an oxide layer on a semiconductor substrate, the oxide layer and the semiconductor substrate forming a substrate-oxide interface, in which the interface includes at least one of silicon-hydrogen bonds or dangling silicon bonds; and exposing the interface to ultraviolet radiation and an atmosphere comprising at least one gas having at least atom capable of forming a silicon-atom bond under conditions sufficient to convert at least a portion of the at least one of silicon-hydrogen bonds or dangling silicon bonds to silicon-atom bonds.

18 Claims, 5 Drawing Sheets

METHOD OF FORMATION OF SEMICONDUCTOR RESISTANT TO HOT CARRIER INJECTION STRESS

TECHNICAL FIELD

The present invention relates to semiconductor devices and the fabrication thereof and, more particularly, to a semiconductor device with reduced degradation resulting from hot carrier injection stress and a method of formation.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important dielectric material for the fabrication of the EEPROM is an oxide-nitride-oxide (ONO) structure. One EEPROM device that utilizes the ONO structure is a silicon-oxide-nitride-oxide-silicon (SONOS) type cell. A second EEPROM device that utilizes the ONO structure is a floating gate FLASH memory device, in which the ONO structure is formed over the floating gate, typically a polysilicon floating gate.

In SONOS devices, during programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon dioxide layer and become trapped in the silicon nitride layer. This jump is known as hot carrier injection (HCI), the hot carriers being electrons. Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in discrete regions within a single continuous silicon nitride layer.

Non-volatile memory designers have taken advantage of the localized nature of electron storage within a silicon nitride layer and have designed memory circuits that utilize two regions of stored charge within an ONO layer. This type of non-volatile memory device is known as a two-bit EEPROM, which is available under the trademark MIRRORBIT™ from Advanced Micro Devices, Inc., Sunnyvale, Calif. The MIRRORBIT™ two-bit EEPROM is capable of storing twice as much information as a conventional EEPROM in a memory array of equal size. A left and right bit is stored in physically different areas of the silicon nitride layer, near the left and right regions of each memory cell. Programming methods are then used to enable the two bits to be programmed and read simultaneously. The two-bits of the memory cell can be individually erased by applying suitable erase voltages to the gate and to either the source or drain regions.

The control gate electrode is separated from the charge storage electrode by a top dielectric layer, and the charge storage electrode is separated from the semiconductor substrate (channel region) by a bottom dielectric layer, forming the oxide-nitride-oxide stack, i.e., the ONO structure or layer. As device dimensions continue to be reduced, the electrical thickness of the top and bottom dielectric layers must be reduced accordingly. Previously, this has been accomplished by scaling down the thickness of the ONO layer. However, as the ONO layer is made physically thinner, leakage currents through the ONO layer may increase, which limits the scaling down of the total physical thickness of the ONO layer. Thus, it becomes more and more important to provide high quality oxide layers, and particularly, a high quality bottom oxide layer, free of defects such as oxygen vacancies, E' centers and dangling bonds.

Some of the improvements in devices can be addressed through development of materials and processes for fabricating the ONO layer. Recently, development efforts have focused on novel processes for fabrication of the ONO layer. While the recent advances in EEPROM technology have enabled memory designers to double the memory capacity of EEPROM arrays using two-bit data storage, numerous challenges exist in the fabrication of material layers within these devices.

In particular, the bottom oxide layer of the ONO structure must be carefully fabricated so that it is resistant to HCI stress. When the bottom oxide layer is formed, silicon-hydrogen bonds and/or dangling silicon bonds may exist at the interface between the Si (wafer) and the bottom layer of the ONO structure, e.g., a $SiO_2$ layer. The energy produced by HCI stress may be sufficient to break the silicon-hydrogen bonds, thereby causing device degradation (e.g. V+shift, drain current reduction, etc.). When such high voltages are used, channel carriers can be sufficiently energetic to enter an insulating layer and degrade device behavior. For example, in silicon-based P-channel MOSFETs, channel strength can be reduced by trapped energetic holes in the oxide which lead to a positive oxide charge near the drain. On the other hand, in N-channel MOSFETs, gate-to-drain shorts may be caused by electrons entering the oxide and creating interface traps and oxide wear-out. Accordingly, advances in ONO fabrication technology are needed to eliminate or remove hydrogen bonding between the Si wafer and ONO structures used, for example, in MIRRORBIT™ two-bit EEPROM devices.

DISCLOSURE OF THE INVENTION

The present invention, in one embodiment, relates to a process for fabricating a semiconductor device that is resistant to hot carrier induced stress. In one embodiment, the method includes steps of providing a semiconductor substrate, forming an oxide layer on the semiconductor substrate, the oxide layer and the semiconductor substrate forming a substrate-oxide interface, and the interface comprising at least one of silicon-hydrogen bonds or dangling silicon bonds; and exposing the interface to ultraviolet radiation and an atmosphere comprising at least one gas having at least one atom capable of forming silicon-atom bonds, whereby at least a portion of silicon-hydrogen bonds are replaced with silicon-atom bonds.

In another embodiment, the present invention relates to a process for fabricating a semiconductor device including steps of providing a semiconductor substrate; forming an oxide layer on the semiconductor substrate, the oxide layer and the semiconductor substrate forming a substrate-oxide interface, and the interface comprising at least one of silicon-hydrogen bonds or dangling silicon bonds; and exposing the interface to ultraviolet radiation and an atmosphere comprising at least one gas having at least one atom capable of forming silicon-atom bonds, whereby at least a portion of silicon-hydrogen bonds are replaced with silicon-atom bonds.

In another embodiment, the present invention relates to a process for fabricating a semiconductor device including steps of providing a semiconductor substrate; forming an oxide layer on the semiconductor substrate, the oxide layer and the semiconductor substrate forming a substrate-oxide interface, and the interface comprising at least one of silicon-hydrogen bonds or dangling silicon bonds; exposing the interface to ultraviolet radiation at an energy sufficient to break silicon-hydrogen bonds, an atmosphere comprising at least one gas having at least one atom capable of forming silicon-atom bonds, and a temperature ranging from about 500° C. to about 1100° C., under conditions sufficient to convert at least a portion of the at least one of silicon-hydrogen bonds or dangling silicon bonds to silicon-atom bonds; and forming a dielectric charge storage layer on the oxide layer, wherein the at least one reactive gas comprises one or more of deuterium, oxygen, nitric oxide, nitrous oxide, ozone, or singlet oxygen, and the inert gas comprises one or more of a noble gas or nitrogen, and the atmosphere comprises from about 5% by volume to about 95% by volume of the at least one reactive gas and from about 95% by weight to about 5% by weight of the at least one inert gas.

Thus, the present invention provides a solution to the problem of hot carrier injection induced stress at the interface between a substrate and an overlying oxide layer due to the presence of either or both of silicon-hydrogen bonds which can be converted to dangling silicon bonds, and dangling silicon bonds.

Figure 1:
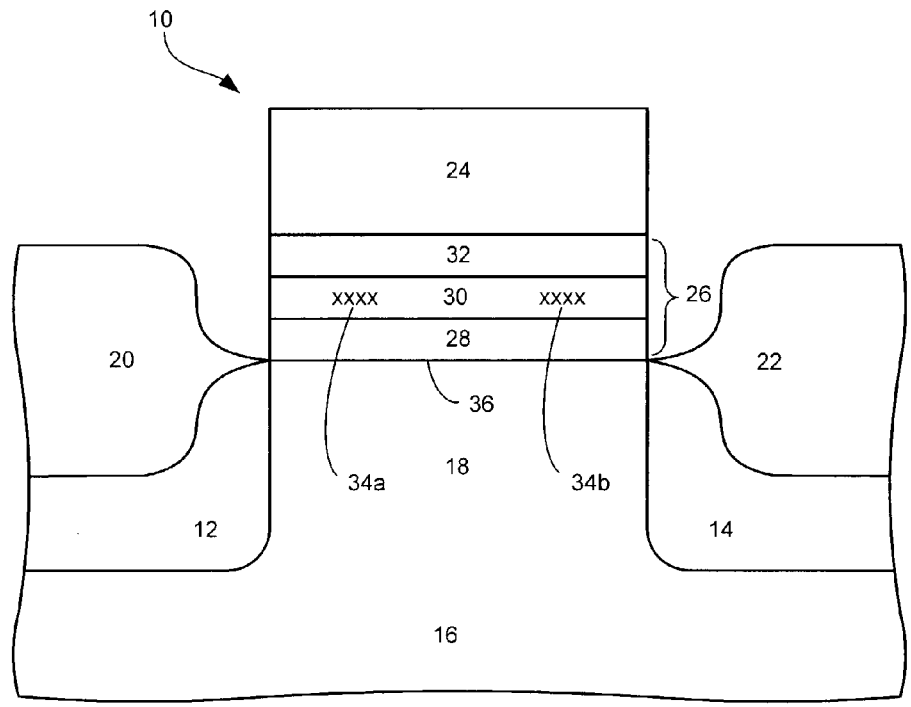
FIG. 1 illustrates a portion of a semiconductor substrate containing a two-bit EEPROM transistor which incorporates an ONO structure fabricated in accordance with the invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF THE INVENTION

It should be appreciated that the process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention.

Furthermore, it should be appreciated that while the present invention will be described in terms of a two-bit EEPROM device, the present invention is not limited to such device, and is applicable to a broad range of semiconductor devices and their fabrication processes. Generally speaking the semiconductor devices will include at least one active component therein, for example a diode, transistor, thyristor or the like. Illustrative examples include MOS-based devices such as MOSFET devices, including CMOS and NMOS technology, light-emitting diodes, laser diodes, and the like. In this regard, the MOS-based technology discussed herein is intended to encompass the use of gate conductors other than metals as is commonly practiced, and thus reference to MOS-based devices encompasses other insulated gate technologies (e.g. IGFETs). While aspects of the present invention will now be described in more detail with reference to a two-bit EEPROM device, it will be understood that the invention is applicable to the above-mentioned and other semiconductor devices which are susceptible to aging due to hot-carrier effects and generally the effects of energetic charge carriers.

Turning now to FIG. 1, there is schematically shown in cross-section a transistor 10 suitable for use in a two-bit EEPROM device, such as the MIRRORBIT™. The transistor 10 includes source/drain regions 12 and 14 located in a semiconductor substrate 16 and separated by a channel region 18. First and second bit line oxide regions 20 and 22 overlie the source/drain regions 12 and 14, respectively. A gate electrode 24 overlies the channel region 18 and is separated therefrom by an ONO structure 26. The gate electrode 24 and the ONO structure 26 form a stacked-gate structure. The ONO structure 26 includes a bottom silicon dioxide layer 28, a silicon nitride layer 30 and a top oxide layer 32, in that order as shown in FIG. 1. A substrate-oxide interface 36 is formed between the substrate 16 and the lower surface of the bottom oxide layer 28. As shown in FIG. 1, charges 34a and 34b may be stored in the silicon nitride layer 30, which acts as a charge or electron storage layer in the SONOS or two-bit EEPROM device.

The following description of the process of the present invention is described in the context of an ONO structure suitable for use in a two-bit EEPROM device, such as the MIRRORBIT™ device. It is to be understood that, while the present invention is discussed herein in that context, that this is merely exemplary and is not intended to limit the scope of the present invention. The ONO structure fabricated by the presently disclosed method is applicable to any semiconductor device in which an ONO structure may be included, and may be applicable to a floating gate FLASH device in which an ONO structure forms an interpoly dielectric. In addition, the present invention is applicable more generally to any device having an interface between a substrate, e.g., silicon, and an overlying oxide layer, e.g., silicon dioxide or a high-K metal oxide, in which silicon-hydrogen bonds or dangling silicon bonds may be present and may be undesirable, for reasons such as an adverse affect on performance of the interface and/or the device of which the interface is a component.

In the operation of the exemplary two-bit EEPROM transistor 10, voltages are applied to the gate electrode 24 and as appropriate to the source/drain regions 12 and 14. The applied voltages cause electrical charge from the source/drain regions 12 and 14 to propagate across the channel region 18. During programming, once the charge encounters a sufficiently strong vertical field, the charge either is injected or tunnels from the channel region 18 through the bottom oxide layer 28 into the silicon nitride charge storage layer 30. Such charge tunneling may be referred to as hot carrier injection (HCI). The charge storage layer may also be referred to as an electron storage layer. For example, depending upon the particular voltage levels applied to the control-gate electrode 24 and to the source/drain regions 12 and 14, the electrical charges 34a, 34b are injected from the channel region 18 across the interface 36, through the bottom oxide layer 28 and into the silicon nitride layer 30. The charges 34a, 34b are localized to regions in proximity to either the source/drain region 12, or the source/drain region 14, as shown in FIG. 1.

Those skilled in the art will recognize that for proper functioning of a two-bit EEPROM device, the electrical charges 34a, 34b preferably remain isolated in the regions of the silicon nitride layer 30 to which it is initially introduced. Furthermore, those skilled in the art generally believe that dangling bonds at the interface 36 between the bottom oxide layer 28 and the channel region 18 of the substrate 16 cause non-ideal capacitance voltage characteristics and reduced channel conductance. After forming the interface, dangling silicon bonds are suitably passivated. Such passivation can occur either pre-metallization or post-metallization. For example, a low temperature anneal may be performed in a hydrogen-containing atmosphere to form silicon-hydrogen bonds from the dangling silicon bonds. In addition, it will be appreciated by those skilled in the art that silicon-hydrogen bonds can also result from or be introduced during the process of forming the bottom oxide layer 28 at the channel region 18. Silicon-hydrogen bonds, however, are easily broken during HCI, forming dangling bonds at the interface 36, and thereby causing a degradation in performance characteristics.

Figure 2:
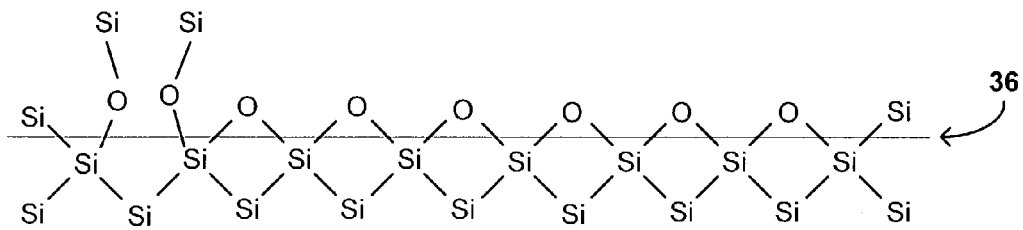
FIGS. 2–4 are schematic diagrams of an interface between a substrate and an overlying oxide layer, in accordance with the present invention.
Figure 3:
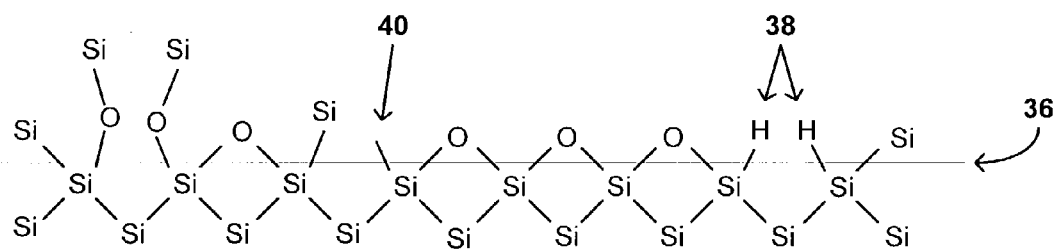
Figure 4:
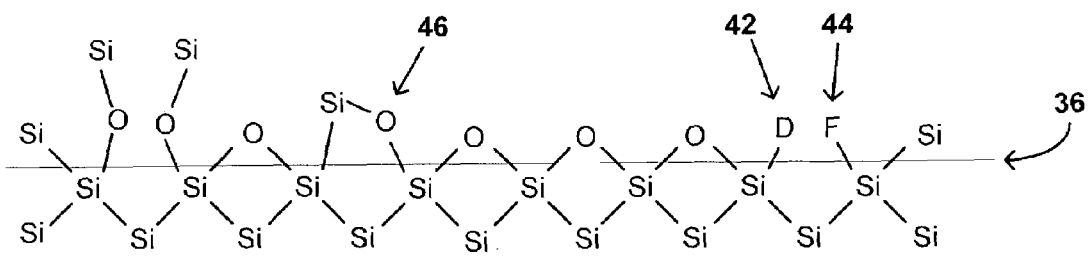

FIGS. 2–4 are schematic diagrams showing an interface 36 between a silicon substrate 16 and a silicon dioxide layer, e.g., a bottom oxide layer 28, formed on the silicon substrate. Those of skill in the art will recognize that the depiction of the interface 36 shown in FIGS. 2–4 is highly schematic and is presented here for exemplary purposes only, and not for any limited purpose.

FIG. 2 is a schematic diagram of an "ideal" interface 36, in which there are no silicon-hydrogen bonds and no dangling silicon bonds. Such an ideal interface is rarely achieved in practice due, for example, to the many variable involved in formation of such an interface. It is noted that, in accordance with the highly schematic and exemplary nature of these diagrams, rather than the Si—O—Si bonds shown in which both Si atoms are in the substrate, it may be more common in an actual substrate-oxide interface that the Si—O—Si bonds at the interface 36 may comprise one Si atom from the substrate and one Si atom from the silicon dioxide layer 28.

FIG. 3 is a schematic diagram of an interface 36 which includes both silicon-hydrogen bonds 38 and dangling silicon bonds 40. As described above, such silicon-hydrogen bonds are easily cleaved to form dangling silicon bonds 40. As described above, dangling silicon bonds act as traps for electrons being injected or transferred from the channel region 18 past the interface 36, through the bottom oxide layer 28 and into the charge storage layer 30.

FIG. 4 is a schematic diagram of the interface 36 after the method of the present invention has been carried out on the interface 36 shown in FIG. 3. As shown in FIG. 4, one of the silicon-hydrogen bonds 38 has been replaced by a silicon-deuterium bond 42, and the other of the silicon-hydrogen bonds 38 has been replaced by a silicon-fluorine bond 44. In addition, the dangling silicon bond 40 has been replaced by a silicon-oxygen-silicon bond 46. The interface shown in FIG. 4 is one which, while theoretically possible, is merely exemplary of three possible embodiments of the present invention. To wit, in an embodiment of the present invention in which the reactive gas comprises deuterium, the silicon-hydrogen bond 38 or the dangling silicon bond 40 may result in formation of the silicon-deuterium bond 42. In an embodiment of the present invention in which fluorine is implanted following irradiation, the silicon-hydrogen bond 38 or the dangling silicon bond 40 may result in formation of the silicon-fluorine bond 44. In an embodiment of the present invention in which the reactive gas comprises oxygen or a source of reactive oxygen, the silicon-hydrogen bond 38 or a dangling silicon bond 40 may result in formation of the silicon-oxygen-silicon bond 46. As will be understood, use of a mixture of these reactive gases may result in formation of more than one of the bonds 42, 44 or 46 shown in FIG. 4.

In accordance with the invention, silicon-hydrogen bonds and dangling silicon bonds are replaced with stronger bonds, formed by a reaction between silicon and a reactive gas, thereby making the device more resistant to HCI-induced degradation. The improved device performance obtained by the present invention can be better understood following a description of an ONO fabrication process carried out in accordance with the invention.

In accordance with the invention, the interface 36 is exposed to ultraviolet radiation and an atmosphere comprising at least one gas having at least one atom capable of forming silicon-atom bonds, whereby at least a portion of silicon-hydrogen bonds are replaced with silicon-atom bonds. In one embodiment, the at least one atom comprises one or more of deuterium, oxygen or a source of reactive oxygen. In one embodiment, the source of reactive oxygen comprises one or more of nitric oxide, nitrous oxide, ozone, or singlet oxygen. In one embodiment, the atmosphere further comprises one or more of a noble gas or nitrogen together with the at least one atom. In one embodiment, the atmosphere comprises from about 5% by volume to about 100% by volume of the at least one atom and from about 95% by weight to about 0% by weight of the at least one inert gas. In one embodiment, the reaction conditions to which the interface 36 is exposed comprise a temperature in the range from about 300° C. to about 1000° C. In one embodiment, the ultraviolet radiation is applied at an energy sufficient to break silicon-hydrogen bonds. In one embodiment, the ultraviolet radiation is applied at an energy of at least 3.3 eV.

Figure 8:
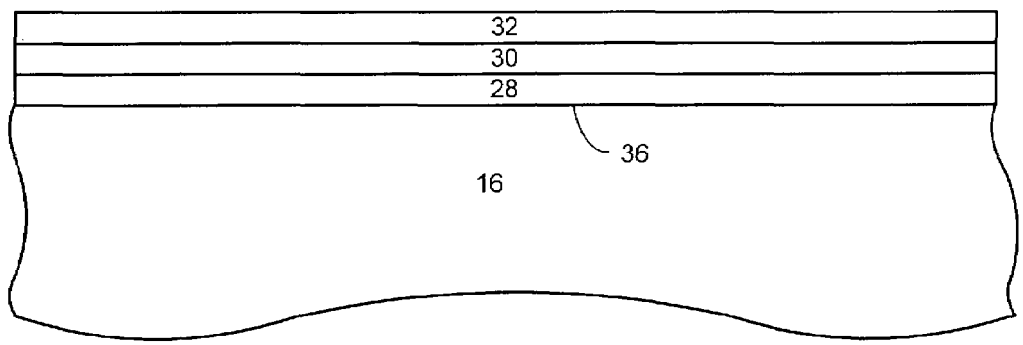
Figure 9:
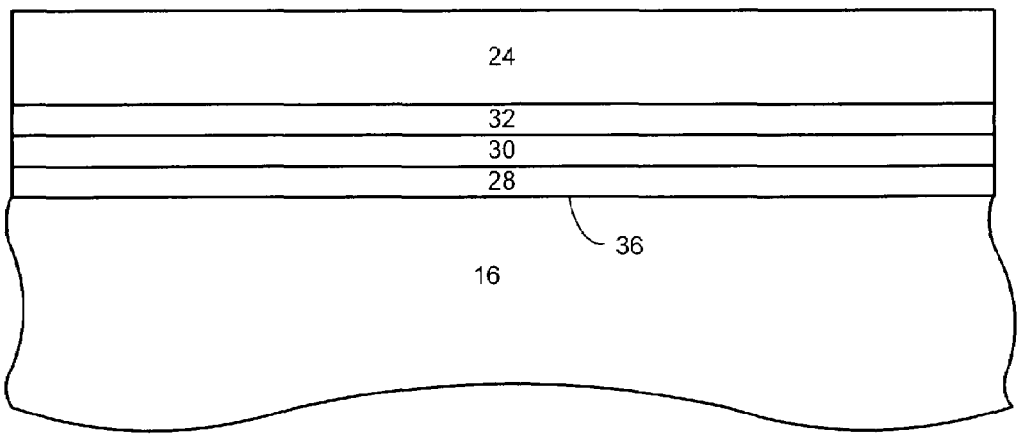
Figure 10:
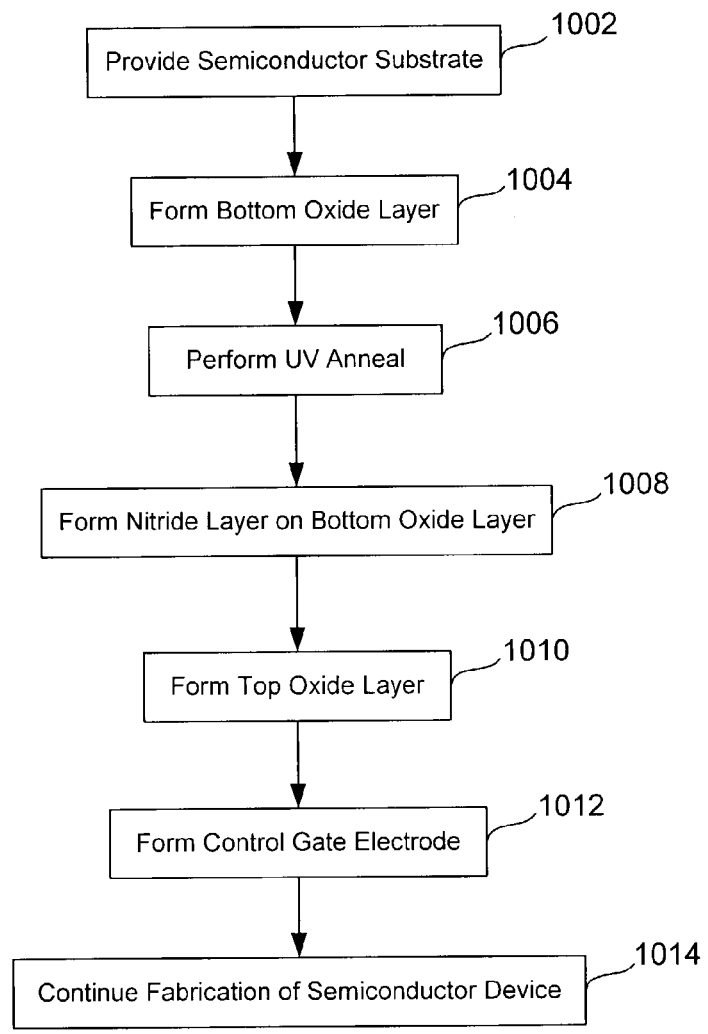
FIG. 10 is a schematic flow diagram generally illustrating steps of the present invention including a pre-metallization anneal.
Figure 11:
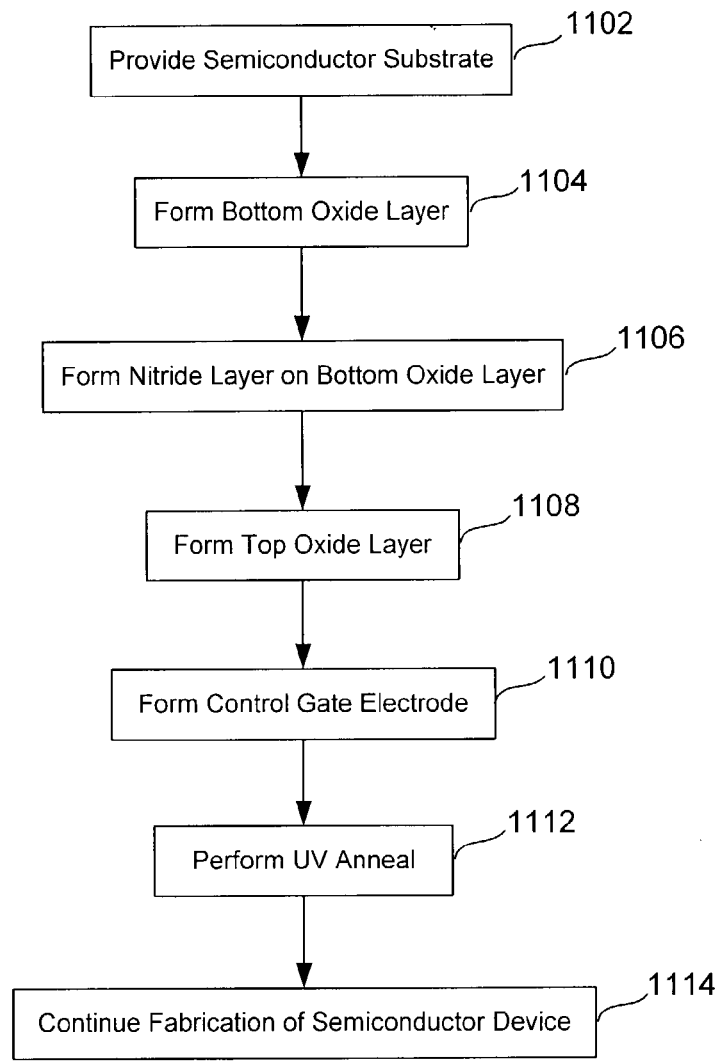
FIG. 11 is a schematic flow diagram generally illustrating steps of the present invention including a post-metallization anneal.

The following description of the present invention follows with reference to FIGS. 5–11. FIGS. 5–9 illustrate, in cross-section, process steps for the fabrication of an ONO structure and a gate structure thereover, in accordance with the invention. FIGS. 10 and 11 are schematic flow diagrams generally illustrating steps of processes in accordance with the present invention.

The first step of both embodiments is the same. In the first step of the present invention, shown schematically in FIG. 10 as step 1002 and in FIG. 11 as step 1102, a semiconductor substrate is provided. The semiconductor substrate can be any appropriately selected semiconductor substrate known in the art. For example, the semiconductor substrate can be a bulk silicon substrate, a silicon-on-insulator semiconductor substrate, a p-doped silicon substrate. Suitable semiconductor substrates include, for example, bulk silicon semiconductor substrates, silicon-on-insulator (SOI) semiconductor substrates, germanium-on-insulator (GOI), silicon-on-sapphire (SOS) semiconductor substrates, and semiconductor substrates formed of other materials known in the art. The present invention is not limited to any particular type of semiconductor substrate.

In one embodiment, the bottom oxide layer 28 is silicon dioxide. However, it will be appreciated by those skilled in the art that the bottom oxide layer 28 is not limited to silicon dioxide. In one embodiment, the bottom oxide layer 28 comprises a high-K dielectric material, a composite dielectric material, or a material substantially free of any high-K dielectric material. As used herein, the term "high-K dielectric material" refers to a dielectric material having a K of about 10 or more. Such high-K dielectric materials include, for example, $HfO_2$, $ZrO_2$ and others, some of which are identified more fully below. In general, the term "high-K dielectric material" encompasses binary, ternary and higher oxides and any ferroelectric material having a K of about 10 or more. In addition, the high-K dielectric materials include, for example, composite dielectric materials such as hafnium silicate, which has a K of about 14, and hafnium silicon oxynitride, which has a K of about 16, depending on the relative content of oxygen and nitrogen, and hafnium silicon nitride, which has a K of about 18.

Suitable high-K dielectric materials include $ZrO_2$, $HfO_2$, $Al_2O_3$, $Y_2O_3$, $La_2O_3$, silicates of one or more of $ZrO_2$, $HfO_2$, $Al_2O_3$, $Y_2O_3$, $La_2O_3$ or aluminates of one or more of $ZrO_2$, $HfO_2$, $Y_2O_3$, $La_2O_3$. Suitable high-K dielectric materials also include tantalum oxide ($Ta_2O_5$), barium titanate (BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$) PZN ($PbZn_xNb_{1-x}O_3$), and PST ($PbSc_xTa_{1-x}O_3$). In addition to the foregoing high-K dielectrics, other high-K dielectric materials, for example, ferroelectric high-K dielectric materials such as lead lanthanum titanate, strontium bismuth tantalate, bismuth titanate and barium zirconium titanate can be used in the present invention. Other high-K dielectric materials known in the art, including, for example binary and ternary oxides having K values of about 10 or higher, also may be used in the present invention.

As used herein, the term "composite dielectric material" refers to a dielectric material comprising the elements of at least two other dielectric materials. A composite dielectric material generally has a K value greater than 10, as defined above for a high-K dielectric material. A composite dielectric material may be, for example, a mixed-metal oxide, a metal silicate, a metal aluminate or a metal mixed-aluminate/silicate. Thus, for example, using hafnium as the exemplary metal, the composite dielectric material may be hafnium-zirconium oxide ($Hf_xZr_{1-x}O_2$, where x ranges between 0 and 1), hafnium silicate ($HfSiO_4$), hafnium aluminate ($HfAl_2O_5$) or a hafnium mixed-aluminate/silicate, $HfO_2/SiO_2/Al_2O_3$, which may have a formula such as $Hf_2Si_2Al_2O_{11}$. A composite dielectric material may be formed by co-deposition of its component elements, or by sequential deposition followed by a treatment step, e.g., thermal treatment, to combine the elements to form the composite dielectric material. Suitable metals for the mixed-metal oxide, metal silicate, metal aluminate or metal mixed-aluminate/silicate include, for example, hafnium, zirconium, yttrium, cerium, tantalum, titanium, lanthanum, tungsten, bismuth, barium, strontium, scandium, niobium or lead, or mixtures thereof. Other metal oxides which, when combined with another metal oxide, silicon dioxide or aluminum oxide, or a mixture thereof, yield a material having a K value greater than that of silicon dioxide may be suitable. For example, the mixed-metal oxide, metal silicate, metal aluminate or metal mixed-aluminate/silicate is suitably one which substantially does not react with silicon (or polysilicon or polysilicon-germanium) at temperatures of about 600–800° C.

As used herein, the term "polysilicon-germanium" refers to a mixture of polysilicon and germanium, in which the germanium content varies from slightly more than zero up to about 60% by weight by the mixture. Thus, the amount of germanium may range from a doping amount up to about 60% by weight, of the mixture. The polysilicon-germanium may be formed by any method known in the art, i.e., by doping polysilicon with germanium, or by co-deposition, for example.

Figure 5:
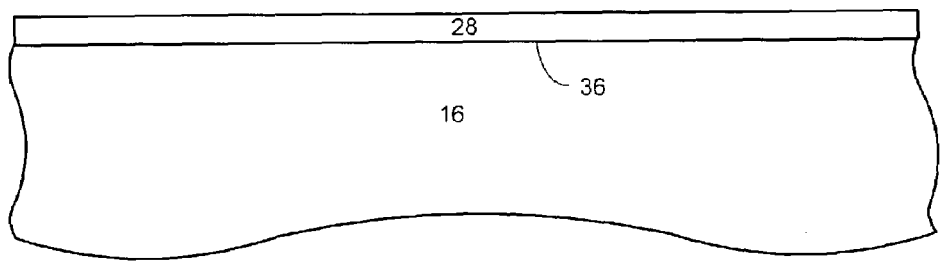
FIGS. 5–9 illustrate, in cross-section, process steps for the fabrication of an ONO structure and a gate structure thereover in accordance with the invention.

Turning now to FIG. 5, the formation of the bottom oxide layer 28 is illustrated. This step is shown schematically in FIG. 10 as step 1004 and in FIG. 11 as step 1104. In accordance with the present invention, a bottom oxide layer 28 is suitably formed on a surface of the semiconductor substrate 16, creating the interface 36. The surface can be the upper surface of a single crystal silicon substrate. In addition, the surface has suitably been previously processed to remove contaminants and native oxide. A suitable pre-clean procedure includes cleaning the surface with a dilute solution of hydrofluoric acid or any standard cleaning procedure used in the semiconductor industry.

The bottom oxide layer 28 can also be formed by oxidation of the surface of the semiconductor substrate 16. The oxidation is suitably carried out by any appropriate oxidation process known in the art for forming a silicon dioxide bottom oxide by oxidation of a silicon surface, such as in a rapid thermal process (RTP) apparatus of any type known in the art. For example, the RTP apparatus can be part of a single-wafer cluster tool.

The oxidation of the silicon surface can be carried out by placing a wafer in the RTP apparatus and flowing oxygen-containing gas, together with other appropriate gases, into the chamber at suitable flow rates and pressure. The temperature of the RTP can be in the range from about 800° C. to about 1100° C. The flow rates and temperature are suitably selected to provide rapid oxidation of the silicon surface, to form an oxide layer of desired thickness. The oxygen-containing gas can be, for example, oxygen gas $O_2$ or nitrous oxide $N_2O$. The oxidation of the silicon surface suitably continues for a period sufficient to provide a desired thickness of the bottom oxide layer 28. Such period can range from about 5 seconds to about 500 seconds. In one embodiment, the oxidation continues for a period from about 30 to about 120 seconds.

Here and throughout the specification and claims, the limits of the disclosed ranges and ratios may be combined. Thus, for example, it is intended that the foregoing disclosed time ranges also include ranges from about 5 seconds to about 120 seconds and from about 30 seconds to about 500 seconds, although these ranges are not explicitly set forth.

The bottom oxide layer 28 can also be formed by thermally oxidizing the silicon surface 36 at an elevated temperature in the presence of dry molecular oxygen. The thermal oxidation is suitably carried out at a temperature in the range of about 600° C. to about 900° C. and can be carried out in either a batch-type thermal oxidation furnace, or alternatively, in a single-wafer oxidation apparatus. For example, the thermal oxidation can be carried out in the same RTP apparatus as that in which the other steps of the present process are carried out. The RTP apparatus may also be part of a single-wafer cluster tool.

The step of forming the bottom oxide layer can also be carried out by rapid thermal oxidation (RTO) at a temperature of about 1100° C. in an oxidizing atmosphere. The bottom oxide layer 28 is suitably grown by RTO of the silicon surface of the substrate 16 at an elevated temperature in the presence of dry molecular oxygen. For example, the thermal oxidation is suitably carried out in one embodiment at a temperature in the range of about 1050° C. to about 1150° C., and in one embodiment, from about 1075° C. to about 1125° C. The thermal oxidation process can also be carried out in a batch-type thermal oxidation furnace or in a single-wafer oxidation apparatus, or in the same RTP apparatus as that in which the other steps of the present process are carried out. In one embodiment, the RTP apparatus is part of a single-wafer cluster tool. The oxygen content in the apparatus suitably ranges from about 1 to about 20 volume percent.

The RTO is suitably conducted in an atmosphere comprising oxygen and from about 4 to about 15 volume percent ozone at a temperature of at least about 850° C., up to about 1100° C., and in one embodiment between about 900° C. to about 1000° C. In one embodiment, the oxygen stream contains from about 3 to about 8 volume percent ozone, in another embodiment, from about 4 to about 7 volume percent ozone, and in another embodiment, from about 5 to about 6 volume percent ozone. The atmosphere in the RTO chamber can also contain small amounts of one or more other materials known in the art to enhance the rate of silicon oxidation. Such materials include, for example, chlorine (e.g., HCl, $Cl_2$, etc.), water, etc. If employed, such materials are generally employed at their conventional amounts (e.g., when HCl is employed, it is generally employed up to about 2.5 volume percent HCl).

In one embodiment, in the RTO, the silicon substrate 16 is suitably held in the chamber at the selected temperature for a period ranging from about 10 seconds to about 100 seconds. As will be understood, the time may vary depending on the temperature, the gases used, the thickness of the bottom oxide layer 28 desired to be formed, and other factors known to those of skill in the art. For example, higher temperatures and higher contents of ozone and/or other oxidation enhancing agents generally require shorter times. As a result of the RTO process, a bottom oxide layer 28 of an ONO structure is formed on the surface of the semiconductor substrate.

The bottom oxide layer 28 can also be formed by a deposition process, such as a rapid-thermal-chemical-vapor-deposition (RTCVD) process. The RTCVD deposition can be carried out in the same RTP apparatus as that in which the other steps of the present process are carried out. In one embodiment, the RTP apparatus is part of a single-wafer cluster tool. The bottom oxide can also be formed by depositing the oxide in a batch furnace by a low-pressure-chemical-vapor-deposition (LPCVD) process. In one embodiment, the top oxide layer 32 is deposited by another suitable method, such as PECVD, ALD (ALCVD), PLD, MLD or MOCVD. The CVD method may be any appropriate CVD method known in the art.

The bottom oxide layer 28 is suitably formed to have a thickness of from about 20 to about 150 angstroms. In one embodiment, the bottom oxide layer 28 has a thickness of about 100 angstroms. In other embodiments, other known methods may be used for depositing the bottom oxide layer 28. As will be recognized, the thickness of the bottom oxide layer 28 may vary as well.

As a result of the foregoing step 1004, by an appropriate method, the bottom oxide layer 28 is formed. For embodiments where the substrate 16 comprises silicon and the bottom oxide layer 28 is $SiO_2$, the interface 36 may comprise Si—$SiO_2$, silicon dangling bonds and Si—H bonds. For embodiments in which any high-K dielectric material is used as the bottom oxide layer 28, corresponding silicon-metal oxide bonds, Si—H bonds and dangling silicon bonds may exist. In both cases, hydrogen can react with silicon dangling bonds during the formation of the bottom oxide layer 28 on the substrate 16 to form silicon-hydrogen bonds.

Pre-Metallization Anneal

In one embodiment, in the next step of the present invention, shown schematically in FIG. 10 as step 1006, prior to metallization the process comprises exposing the interface 36 to ultraviolet radiation in an atmosphere comprising at least one gas having at least atom capable of forming a silicon-atom bond. Such gases include, for example, $D_2$, oxygen ($O_2$) or a source of reactive oxygen, such as ozone ($O_3$), nitric oxide (NO), nitrous oxide ($N_2O$) or singlet oxygen, (O—) under annealing conditions to remove silicon-hydrogen bonds and dangling silicon bonds from the interface 36. In one embodiment, the atmosphere comprises a source of silicon. In one embodiment, the atmosphere further comprises at least one inert gas, such as a noble gas (He, Ne, Ar, Kr or Rn) or nitrogen ($N_2$). The annealing step results in both the breaking of Si—H bonds and the passivating of Si dangling bonds at the interface 36.

Figure 6:
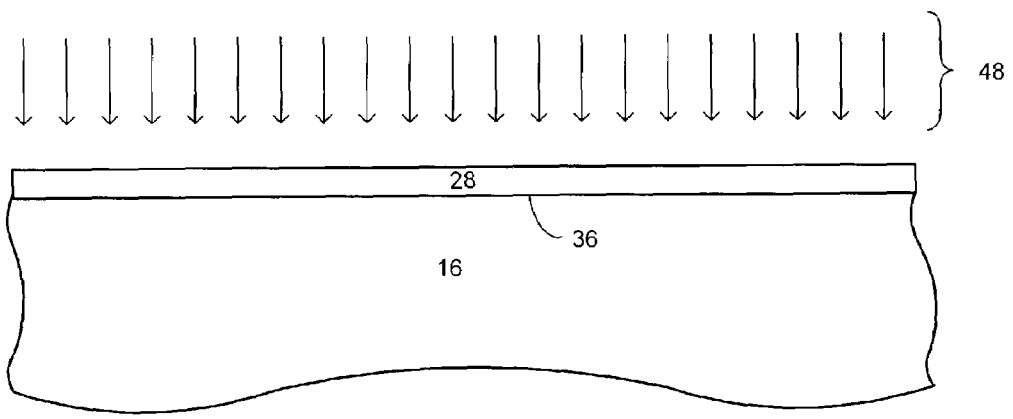

In one embodiment, the ultraviolet radiation is applied at an energy in the range of about 3 eV to about 4 eV so as to be sufficient to break silicon-hydrogen bonds. In one embodiment, the ultraviolet radiation is applied at an energy of at least 3.3 eV. In another embodiment, the ultraviolet radiation is applied at an energy in the range of about 3.3 eV to about 3.6 eV. FIG. 6 schematically illustrates treating the interface 36 to remove silicon-hydrogen bonds and/or dangling silicon bonds by annealing with ultraviolet radiation in an atmosphere comprising at least one gas having at least atom capable of forming a silicon-atom bond, shown schematically by arrows 38. The arrows 38 schematically illustrate the UV radiation and the atoms or ions being added to the interface 36 by an anneal process, such as by one of the methods described in the following.

In one embodiment, in the exposing step, the interface 36 is suitably annealed in an atmosphere comprising $D_2$. In one embodiment, the annealing conditions are similar to a rapid thermal anneal, except for the presence of the ultraviolet radiation and the gas.

In one embodiment, in the exposing step, the interface 36 is annealed at a temperature in the range from about 300° C. to about 1100° C., in one embodiment from about 500° C. to about 1000° C. and in another embodiment from about 700° C. to about 950° C. The temperature range may be limited by impurity diffusion in silicon, as will be appreciated by those skilled in the art.

In one embodiment, in the exposing step, a RTA is performed for a period ranging from about 5 seconds to about 5 minutes, and in one embodiment, for a period ranging from about 15 seconds to about 60 seconds. In one embodiment, the anneal is performed in a furnace for a period ranging from about 1 minute to about 3 hours, and in one embodiment, for a period ranging from about 30 minutes to about 1 hour.

In one embodiment, in the exposing step, the atmosphere is substantially 100% $D_2$. In one embodiment, the atmosphere comprises $D_2$ and at least one inert gas. In such embodiment, the ratio of at least one inert gas to $D_2$ the ranges from about 1:20 to about 20:1, and in another embodiment, the ratio ranges from about 1:10 to about 1:2, and in another, the ratio ranges from about 1:7 to about 1:5. In one embodiment, the atmosphere comprises from about 5% by volume to about 100% by volume of the deuterium gas and from about 95% by weight to about 0% by weight of the at least one inert gas. In one embodiment, the atmosphere comprises from about 5% by volume to about 95% by volume of deuterium and from about 95% by weight to about 5% by weight of the at least one inert gas.

In one embodiment, ultraviolet radiation is applied and then fluorine is implanted. Following fluorine implantation, an anneal is performed in an inert atmosphere.

In one embodiment, in the exposing step, the atmosphere comprises oxygen or a source of reactive oxygen as the at least one gas having at least atom capable of forming a silicon-atom bond. In one embodiment, the atmosphere comprises both oxygen or a source of reactive oxygen and at least one inert gas. In one embodiment, the atmosphere comprises from about 5% by volume to about 95% by volume of the oxygen or a source of reactive oxygen and from about 95% by weight to about 5% by weight of the at least one inert gas. As disclosed above, the source of reactive oxygen may include one or more of oxygen, ozone, nitric oxide, nitrous oxide or singlet oxygen.

In the exposing step, the pressure ranges from about 1 torr to about 2000 torr. In one embodiment, the pressure is about 760 torr. In one embodiment, the pressure ranges from about 1 torr to about 300 torr. In one embodiment, the pressure is greater than about 760 torr.

In one embodiment, the step of exposing the interface to ultraviolet radiation and an atmosphere comprising at least one gas having at least atom capable of forming a silicon-atom bond is repeated at least one additional time, and in one embodiment, the annealing step is repeated from two to about five times, as deemed necessary. Although not to be bound by theory, the ultraviolet radiation in conjunction with the elevated temperatures may be considered to primarily help break Si—H bonds, while the gas used in the annealing process may be considered to primarily passivate dangling Si bonds, both those formed in the process and those preexisting at the interface 36.

Figure 7:
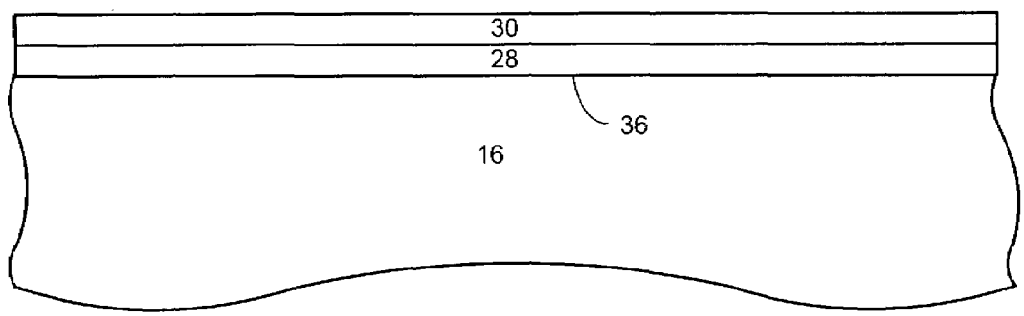

In the next step of the present invention, shown schematically in FIG. 10 as step 1008 and in FIG. 11 as step 1106, a charge storage layer 30 is formed on the bottom oxide layer 28. As shown in FIG. 7, after forming the bottom oxide layer 28, the charge storage layer 30 is deposited on the bottom oxide layer 28. In one embodiment, the charge storage layer 30 comprises silicon nitride. In another embodiment, the charge storage layer comprises a suitable high-K dielectric material. In another embodiment, the charge storage layer 30 comprises both a high-K dielectric material and a standard-K dielectric material, such as silicon nitride. In one embodiment, the layer 30 comprises a composite dielectric material, which comprises a composite or a reaction product of two or more dielectric materials, one of which is a high-K dielectric material and the other of which may be a standard-K dielectric material such as silicon nitride. Thus, in one embodiment, the high-K dielectric material completely replaces silicon nitride in the charge storage layer 30. In another embodiment, the high-K dielectric material is, in essence, added to or combined with, silicon nitride to form a charge storage layer 30. In another embodiment, the charge storage layer 30 includes a composite dielectric material which replaces silicon nitride. Suitable high-K dielectric materials for use in a high-K charge storage layer are disclosed in copending U.S. application Ser. No. 10/036,757, filed Dec. 31, 2001, which is incorporated herein by reference for its disclosure relating to high-K dielectric materials for use in a charge storage layer of an ONO structure. Suitable methods for deposition of a high-K dielectric material layer include RTCVD carried out at a temperature of about 400° C. to about 800° C. The high-K dielectric material may be formed by reacting a suitable metal-containing gas, e.g., hafnium tetra-t-butoxide with a suitable oxygen-containing gas, e.g., oxygen ($O_2$) or nitrous oxide ($N_2O$).

In one embodiment, the high-K dielectric material may be deposited by other chemical vapor deposition (CVD) methods. The CVD method may be any appropriate CVD method known in the art for deposition of a high-K material. For example, the CVD method may be ALD (ALCVD), PECVD, MOCVD or MLD, in addition to the above-mentioned RTCVD.

In one embodiment, the high-K dielectric material includes at least one of hafnium oxide ($HfO_2$), zirconium oxide ($ZrO_2$), tantalum oxide ($Ta_2O_5$), barium titanate (Ba-$TiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), silicon titanate ($SiTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$). In addition to the foregoing high-K dielectrics, other high-K dielectric materials, for example, ferroelectric high-K dielectric materials such as lead lanthanum titanate, strontium bismuth tantalate, bismuth titanate and barium zirconium titanate may be suitably used in the present invention. Other high-K dielectric materials known in the art, including, for example binary and ternary oxides having K values of about 20 or higher, also may be used in the present invention.

With respect to embodiments in which the charge storage layer comprises materials other than a nitride, herein the combined structure 26, including the charge storage layer 30 and the two oxide layers 28, 32 between which it is sandwiched, is referred to as an ONO structure, even though the "N" layer may be other than a nitride.

In one embodiment, the charge storage layer 30 is silicon nitride formed by means of a RTCVD process. In one embodiment, the RTCVD process is carried out at a temperature of about 700° C. to about 800° C. The silicon nitride material may be formed by reacting a suitable nitrogen-containing gas, e.g., ammonia ($NH_3$) with a suitable silicon-containing gas, e.g., dichlorosilane ($SiCl_2H_2$) or silane ($SiH_4$). In one embodiment, the process is carried out for a period of time and at gas flow rates sufficient to form a silicon nitride layer having a thickness of about 50 to about 200 angstroms. In another embodiment, the process is carried out for a period of time and at gas flow rates sufficient to form a silicon nitride layer having a thickness of about 100 angstroms.

In one embodiment, ammonia is introduced in the RTCVD apparatus at a flow rate of about 1000 sccm and either dichlorosilane or silane is introduced at a flow rate of about 30 to about 50 sccm. The RTCVD process is carried out in three steps including an initial temperature ramp, a deposition step, and cool-down step. In one embodiment, the total reaction time is about 1 to about 3 minutes. In another embodiment, the silicon nitride deposition step is completed in about 2 minutes.

In another embodiment, the charge storage layer 30 is silicon nitride formed by means of a LPCVD process. In this alternative embodiment, the silicon nitride can be formed in a batch deposition apparatus. In one embodiment, the LPCVD process is carried out at an absolute pressure of about 200 to about 500 millitorr (mtorr), at temperatures of about 700–800° C. using ammonia and either dichlorosilane or silane gas.

The charge storage layer 30 may also be deposited by other suitable methods, as will be appreciate by one skilled in the art.

Following deposition of the charge storage layer 30, in the next step of the process of fabricating the flash memory device, shown schematically in FIG. 10 as step 1010 and in FIG. 11 as step 1108, a top oxide layer 32 is formed on the charge storage layer 30 by a suitable technique. The top oxide layer 32 may comprise any of the materials disclosed above for the bottom oxide layer 28. For example, the top oxide layer 32 may comprise silicon dioxide, a high-K dielectric material or a composite dielectric material, as defined herein.

In one embodiment, the top oxide layer 32 is formed by an in-situ steam generation (ISSG) oxidation of the upper surface of the charge storage layer 30. In one embodiment, the top oxide layer 32 is formed by an HTO deposition, such as the RTCVD or LPCVD methods described above. In one embodiment, the top oxide layer 32 is deposited by another suitable method, such as PECVD, ALD (ALCVD), PLD, MLD or MOCVD. The CVD method may be any appropriate CVD method known in the art.

As shown in FIG. 8, after depositing the charge storage layer 30, the top oxide layer 32 is formed on the charge storage layer 30. The top oxide layer 32 may be formed by any appropriate method known in the art. In one embodiment, when the charge storage material is silicon nitride, the top oxide layer 32 is grown by oxidation of a portion of the silicon nitride layer 30. In another embodiment, the top oxide layer 32 is deposited by an appropriate deposition method.

In one embodiment, the top oxide layer 32 is formed by ISSG oxidation of a part of the upper surface of the charge storage layer 30, when it is silicon nitride. A process for forming a top oxide by ISSG oxidation of a silicon nitride layer is disclosed in commonly assigned, copending U.S. application Ser. No. 10/023,548, filed Dec. 17, 2001, the disclosure of which is hereby incorporated by reference for its teachings relating to ISSG oxidation.

In one embodiment, in which the deposition of the silicon nitride layer 30 is carried out by RTCVD in the RTP apparatus, at the completion of the deposition, when the cool-down step has reduced the temperature to about 400 to about 500° C., the apparatus is converted for an ISSG oxidation process without removing the wafer from the apparatus, and without exposing the wafer to the outside atmosphere. Thus, these steps in the fabrication of the SONOS flash memory device may be carried out sequentially in a single apparatus, without removing the wafer from the apparatus between the charge storage layer 30 formation steps and the top oxide layer 32 formation steps.

As shown in FIG. 9, following formation of the ONO structure 26 in accordance with the present invention, shown schematically in FIG. 10 as step 1012 and in FIG. 11 as step 1110, a layer forming a control gate electrode 24 is formed on the top oxide layer 32. The stacked-gate structure shown in FIG. 1 is completed by depositing a layer of gate forming material overlying the top oxide layer 32. The layer forming a control gate electrode 24 may comprise any material known in the art for such use. For example, the control gate electrode layer 24 may comprise polysilicon, polysilicon-germanium, a metal silicide, a metal, or any other suitable material known in the art. A lithographic patterning and etching process may then be carried out to define the stacked gate structure shown in FIG. 1, including the control gate electrode 24 and the ONO structure 26. Those skilled in the art will recognize that various gate-forming materials can be used to fabricate the control gate electrode 24. For example, the control gate electrode 24 can be formed with polycrystalline silicon, amorphous silicon, a refractory metal silicide, a metal, and the like.

Following formation of the control gate electrode 24 and the ONO structure 26, fabrication of the semiconductor device continues, as indicated in the final step 1014 of FIG. 10.

Post-Metallization Anneal

In one embodiment of the present invention, shown schematically in FIG. 11 as step 1112, a post-metallization anneal is carried out. In accordance with this embodiment of the invention, after metallization, the process comprises exposing the interface 36 to ultraviolet radiation in an atmosphere comprising at least one gas having at least atom capable of forming a silicon-atom bond, such as $D_2$, under annealing conditions to remove silicon-hydrogen bonds and dangling silicon bonds from the interface 36. In one embodiment, the atmosphere further comprises at least one inert gas, such as a noble gas (He, Ne, Ar, Kr or Rn) or nitrogen ($N_2$). The annealing step results in both the breaking of Si—H bonds and the passivating of Si dangling bonds at the interface 36.

In one embodiment, in the exposing step, the ultraviolet radiation is applied at an energy in the range of about 3 eV to about 4 eV so as to be sufficient to break silicon-hydrogen bonds. In one embodiment, the ultraviolet radiation is applied at an energy of at least 3.3 eV. In another embodiment, the ultraviolet radiation is applied at an energy in the range of about 3.3 eV to about 3.6 eV.

FIG. 6 schematically illustrates, in the exposing step, treating the interface 36 to remove silicon-hydrogen bonds and/or dangling silicon bonds by annealing with ultraviolet radiation in an atmosphere comprising at least one gas having at least atom capable of forming a silicon-atom bond, shown schematically by arrows 48. The arrows 48 schematically illustrate the UV radiation and the gas atoms or ions being added to the interface 36 by an anneal process, such as by one of the methods described in the following.

In one embodiment, in the exposing step, the interface 36 is suitably annealed in an atmosphere comprising $D_2$. In one embodiment, the annealing conditions are similar to a rapid thermal anneal, except for the presence of the ultraviolet radiation and the gas.

In one embodiment, in the exposing step, the interface 36 is suitably annealed in an atmosphere comprising $D_2$, at a temperature in the range from about 200° C. to about 700° C. In one embodiment, the temperature is less than about 500° C. The temperature range and period range may depend on the properties of the metal.

In one embodiment, in the exposing step, a RTA is performed for a period ranging from about 5 seconds to about 5 minutes, and in one embodiment, for a period ranging from about 15 seconds to about 60 seconds. In one embodiment, the anneal is performed in a furnace for a period ranging from about 1 minute to about 3 hours, and in one embodiment, for a period ranging from about 30 minutes to about 1 hour.

In one embodiment, in the exposing step, the atmosphere is substantially 100% $D_2$. In one embodiment, the atmosphere comprises $D_2$ and at least one inert gas. In such embodiment, the ratio of at least one inert gas to $D_2$ the ranges from about 1:20 to about 20:1, and in another embodiment, the ratio ranges from about 1:10 to about 1:2, and in another, the ratio ranges from about 1:7 to about 1:5. In one embodiment, the atmosphere comprises from about 5% by volume to about 100% by volume of the deuterium gas and from about 95% by weight to about 0% by weight of the at least one inert gas. In one embodiment, the atmosphere comprises from about 5% by volume to about 95% by volume of deuterium and from about 95% by weight to about 5% by weight of the at least one inert gas.

In the exposing step, the pressure ranges from about 1 torr to about 2000 torr. In one embodiment, the pressure is about 760 torr. In one embodiment, the pressure ranges from about 1 torr to about 300 torr. In one embodiment, the pressure is greater than about 760 torr.

In one embodiment, the step of exposing the interface to ultraviolet radiation and an atmosphere comprising at least one gas having at least one atom capable of forming a silicon-atom bond is repeated at least one additional time, and in one embodiment, the annealing step is repeated from two to about five times, as deemed necessary. Although not to be bound by theory, the ultraviolet radiation in conjunction with the elevated temperatures may be considered to primarily help break Si—H bonds, while the gas having at least atom capable of forming a silicon-atom bond used in the annealing process may be considered to primarily passivate dangling Si bonds, both those formed in the process and those preexisting at the interface 36.

Following the exposing step, fabrication of the semiconductor device continues, as indicated in the final step 1114 of FIG. 11.

There has been disclosed in accordance with the invention a process for fabricating an ONO floating-gate electrode, for example for use in a MIRRORBIT™ two-bit EEPROM device, that fully provides the advantages set forth above. Although described in terms of, and particularly applicable to, two-bit EEPROM devices, the present invention is broadly applicable to fabrication of any semiconductor device including an ONO structure. As noted above, the process of the invention may also be applicable to forming the ONO structure in a floating gate FLASH device.

INDUSTRIAL APPLICABILITY

According to the present invention, semiconductor devices that have either silicon-hydrogen bonds or dangling silicon bonds at the interface between the semiconductor substrate and a dielectric layer are susceptible to performance degradation due to hot carrier injection stress. The interface of such devices can be exposed to ultraviolet radiation and an atmosphere of at least one gas having at least atom capable of forming a silicon-atom bond under conditions sufficient to convert the silicon-hydrogen bonds or dangling silicon bonds to at least one of Si—D, Si—Si or Si—O. After exposing the interface, the device is more resistant to hot carrier injection stress, and exhibits less performance degradation due to hot carrier stress than does a device having Si—H or silicon dangling bonds at the interface. Thus, the present invention provides a solution to the problem of hot carrier injection induced stress at the interface between a substrate and an overlying oxide layer due to the presence of either or both of silicon-hydrogen bonds which can be converted to dangling silicon bonds, and dangling silicon bonds.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the individual layers making up the ONO structure can be varied from that described herein. It is therefore intended to include within the invention all such variations and modifications that fall within the scope of the appended claims and equivalents thereof.

What is claimed is:

1. A process for fabricating a semiconductor device comprising:
   providing a semiconductor substrate;
   forming an oxide layer on the semiconductor substrate, the oxide layer and the semiconductor substrate forming a substrate-oxide interface, and the interface comprising at least one of silicon-hydrogen bonds or dangling silicon bonds; and
   exposing the interface to ultraviolet radiation and an atmosphere comprising at least one gas having at least atom capable of forming a silicon-atom bond under conditions sufficient to convert at least a portion of the at least one of silicon-hydrogen bonds or dangling silicon bonds to silicon-atom bonds,
   wherein the at least one gas having at least atom capable of forming a silicon-atom bond comprises one or more of deuterium, oxygen, and a source of reactive oxygen other than nitrous oxide.

2. The process of claim 1, wherein the source of reactive oxygen comprises one or more of nitric oxide, ozone, or singlet oxygen.

3. The process of claim 1, wherein the atmosphere further comprises one or more of a noble gas or nitrogen.

4. The process of claim 3, wherein the atmosphere comprises from about 5% by volume to about 95% by volume of the at least one reactive gas and from about 95% by weight to about 5% by weight of the at least one inert gas.

5. The process of claim 1, wherein the conditions comprise a temperature in the range from about 300° C. to about 1000° C.

6. The process of claim 1, wherein the ultraviolet radiation is applied at an energy sufficient to break silicon-hydrogen bonds.

7. The process of claim 6, wherein the ultraviolet radiation is applied at an energy of at least 3.3 eV.

8. The process of claim 1, wherein the step of exposing is repeated at least one additional time.

9. The process of claim 1 further comprising the steps of:
   forming a dielectric charge storage layer on the oxide layer;
   forming a top oxide layer on the charge storage layer; and
   forming a gate electrode on the top oxide layer.

10. The process of claim 1 wherein the step of exposing the interface to ultraviolet radiation is a pre-metallization step, and the step of exposing is carried out at a temperature ranging from about 500° C. to about 1100° C.

11. The process of claim 1 wherein the step of exposing the interface to ultraviolet radiation is a post-metallization step, and the step of exposing is carried out at a temperature ranging from about 200° C. to about 700° C.

12. A process for fabricating a semiconductor device comprising:

providing a semiconductor substrate;

forming an oxide layer on the semiconductor substrate, the oxide layer and the semiconductor substrate forming a substrate-oxide interface, and the interface comprising at least one of silicon-hydrogen bonds or dangling silicon bonds; and exposing the interface to ultraviolet radiation and an atmosphere comprising at least one gas having at least atom capable of forming a silicon-atom bond and at least one inert gas under conditions sufficient to convert at least a portion of the at least one of silicon-hydrogen bonds or dangling silicon bonds to silicon-atom bonds, wherein the at least one gas having at least atom capable of forming a silicon-atom bond comprises one or more of deuterium, oxygen, and a source of reactive oxygen other than nitrous oxide.

13. The process of claim 12, wherein the source of reactive oxygen comprises one or more of nitric oxide, ozone, or singlet oxygen.

14. The process of claim 12, wherein the atmosphere comprises from about 5% by volume to about 95% by volume of the at least one reactive gas and from about 95% by weight to about 5% by weight of the at least one inert gas.

15. The process of claim 12, wherein the ultraviolet radiation is applied at an energy sufficient to break silicon-hydrogen bonds.

16. The process of claim 12 further comprising the steps of:

forming a dielectric charge storage layer on the oxide layer;

forming a top oxide layer on the charge storage layer; and forming a gate electrode on the top oxide layer.

17. The process of claim 12 wherein the step of exposing the interface to ultraviolet radiation is a pre-metallization step, and the step of exposing is carried out at a temperature ranging from about 500° C. to about 1100° C.

18. A process for fabricating a semiconductor device comprising:

providing a semiconductor substrate;

forming an oxide layer on the semiconductor substrate, the oxide layer and the semiconductor substrate forming a substrate-oxide interface, and the interface comprising at least one of silicon-hydrogen bonds or dangling silicon bonds;

exposing the interface to ultraviolet radiation at an energy sufficient to break silicon-hydrogen bonds, an atmosphere comprising at least one gas having at least atom capable of forming a silicon-atom bond and at least one inert gas, and a temperature ranging from about 500° C. to about 1100° C., under conditions sufficient to convert at least a portion of the at least one of silicon-hydrogen bonds or dangling silicon bonds to at least one of Si—D, Si—Si or Si—O bonds; and forming a dielectric charge storage layer on the oxide layer, wherein the at least one gas having at least atom capable of forming a silicon-atom bond comprises one or more of deuterium, oxygen, nitric oxide, ozone, or singlet oxygen, and the inert gas comprises one or more of a noble gas or nitrogen, and the atmosphere comprises from about 5% by volume to about 95% by volume of the at least one reactive gas and from about 95% by weight to about 5% by weight of the at least one inert gas.

* * * * *